(12) United States Patent
Lee et al.

(10) Patent No.: US 9,349,616 B2
(45) Date of Patent: May 24, 2016

(54) SEMICONDUCTOR DEVICE AND METHOD OF FORMING WLCSP WITH SEMICONDUCTOR DIE EMBEDDED WITHIN INTERCONNECT STRUCTURE

(71) Applicant: STATS ChipPAC, Ltd., Singapore (SG)

(72) Inventors: KyungHoon Lee, Kyunggi-Do (KR);
HyunJin Song, Kyunggi-Do (KR);
KyoungIl Huh, Kyunggi-do (KR);
DaeSik Choi, Seoul (KR)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 13/801,294

(22) Filed: Mar. 13, 2013

(65) Prior Publication Data

US 2014/0264905 A1  Sep. 18, 2014

(51) Int. Cl.
*H01L 23/02* (2006.01)
*H01L 21/56* (2006.01)
*H01L 23/538* (2006.01)
*H01L 23/00* (2006.01)

(52) U.S. Cl.
CPC .......... *H01L 21/568* (2013.01); *H01L 23/5385* (2013.01); *H01L 23/5389* (2013.01); *H01L 24/19* (2013.01); *H01L 24/96* (2013.01); *H01L 2224/0401* (2013.01); *H01L 2224/04105* (2013.01); *H01L 2224/0557* (2013.01); *H01L 2224/12105* (2013.01); *H01L 2224/13025* (2013.01); *H01L 2224/16145* (2013.01); *H01L 2224/16225* (2013.01); *H01L 2224/2518* (2013.01); *H01L 2224/32245* (2013.01); *H01L 2224/48091* (2013.01); *H01L 2224/73209* (2013.01); *H01L 2224/73259* (2013.01); *H01L 2224/73265* (2013.01); *H01L 2224/73267* (2013.01); *H01L 2224/81192* (2013.01); *H01L 2224/92124* (2013.01); *H01L 2224/94* (2013.01); *H01L 2224/96* (2013.01); *H01L 2924/13091* (2013.01); *H01L 2924/18161* (2013.01); *H01L 2924/18162* (2013.01); *H01L 2924/19104* (2013.01)

(58) Field of Classification Search
CPC ................. H01L 2225/06541; H01L 25/0657; H01L 2224/32145; H01L 2224/16145
USPC ......................................... 257/686, 777, 778
See application file for complete search history.

(56) References Cited

U.S. PATENT DOCUMENTS

| | | | |
|---|---|---|---|
| 8,039,304 B2 | 10/2011 | Pagaila | |
| 8,526,186 B2 * | 9/2013 | Yokoya et al. | 361/719 |
| 2008/0036065 A1 * | 2/2008 | Brunnbauer et al. | 257/686 |
| 2008/0136004 A1 * | 6/2008 | Yang et al. | 257/686 |
| 2008/0239686 A1 | 10/2008 | Negishi | |

(Continued)

*Primary Examiner* — S. V. Clark
(74) *Attorney, Agent, or Firm* — Robert D. Atkins; Patent Law Group: Atkins and Associates, P.C.

(57) ABSTRACT

A semiconductor device includes a semiconductor die. An encapsulant is deposited over the semiconductor die. An insulating layer is formed over the encapsulant and a first surface of the semiconductor die. A semiconductor component is disposed over the insulating layer and first surface of the semiconductor die. A first interconnect structure is formed over the encapsulant and first surface of the semiconductor die to embed the semiconductor component. A conductive via is formed in the semiconductor die. A heat sink is formed over the semiconductor die. A second interconnect structure is formed over a second surface of the semiconductor die opposite the first surface. A conductive layer is formed over the semiconductor component. An opening is formed in the insulating layer.

15 Claims, 16 Drawing Sheets

(56) References Cited

U.S. PATENT DOCUMENTS

| | | |
|---|---|---|
| 2011/0031634 A1 | 2/2011 | Pagaila |
| 2011/0037157 A1* | 2/2011 | Shin et al. .................... 257/686 |
| 2013/0093073 A1* | 4/2013 | Chen et al. .................... 257/686 |
| 2013/0099073 A1* | 4/2013 | Bradbury .................. 248/200.1 |

* cited by examiner

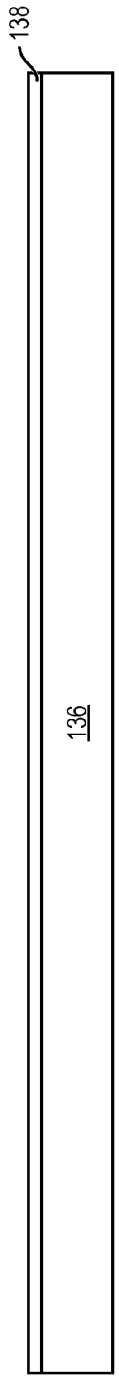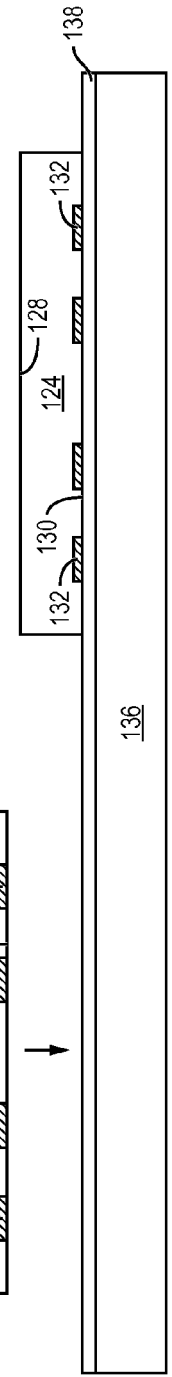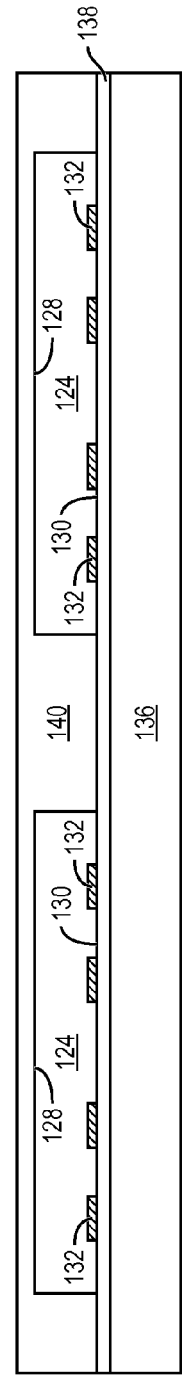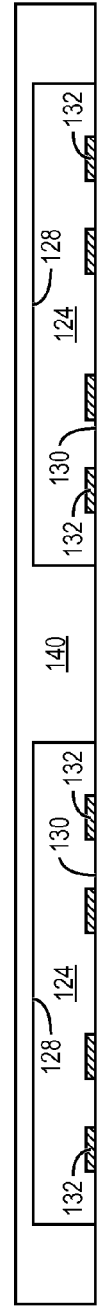
FIG. 3d
FIG. 3e
FIG. 3f
FIG. 3g

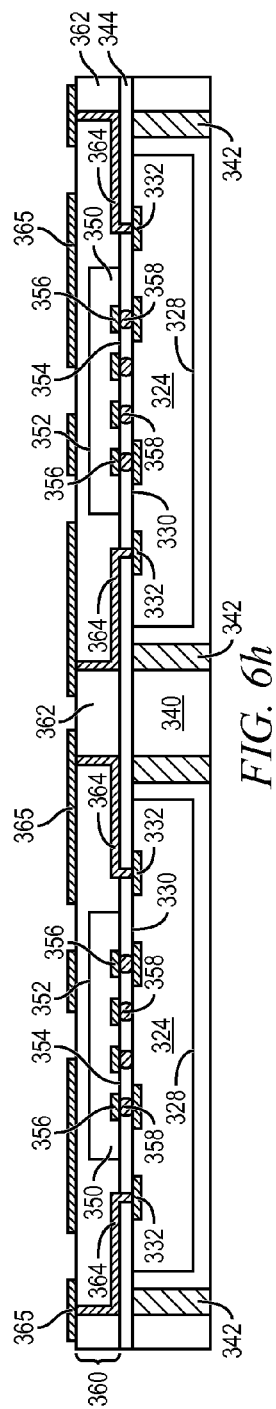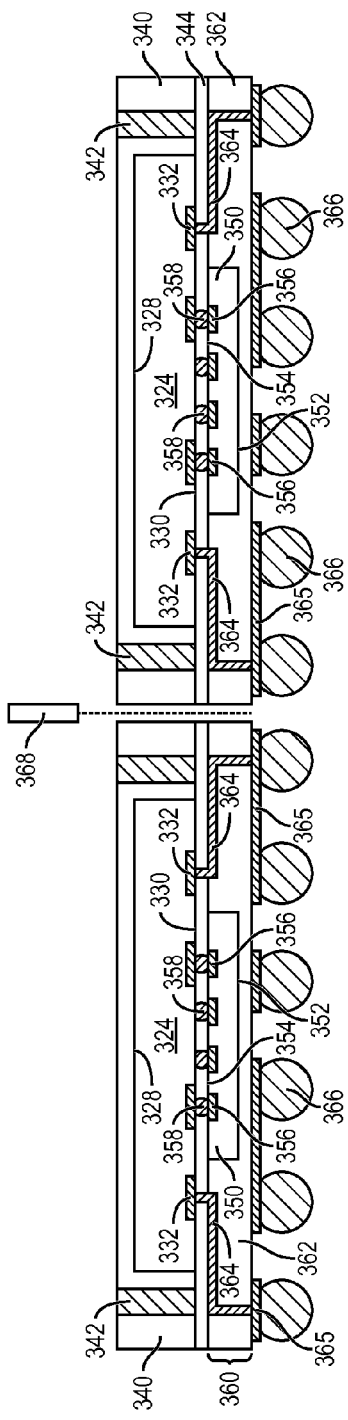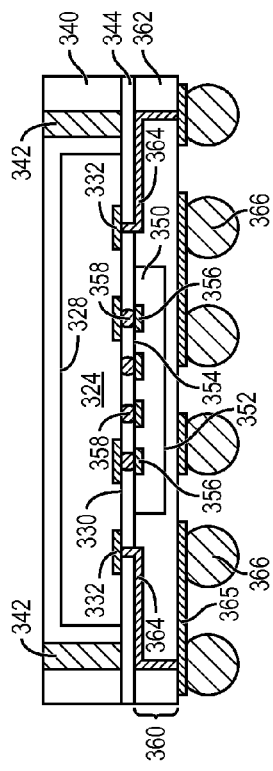

SEMICONDUCTOR DEVICE AND METHOD OF FORMING WLCSP WITH SEMICONDUCTOR DIE EMBEDDED WITHIN INTERCONNECT STRUCTURE

FIELD OF THE INVENTION

The present invention relates in general to semiconductor devices and, more particularly, to a semiconductor device and method of mounting a second semiconductor die over a first semiconductor die on a wafer level chip scale package (WLCSP) structure. The second semiconductor die is embedded in build-up interconnect layers.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

In high-speed semiconductor devices, such as used in communication applications, stacked semiconductor die need to communicate in a fast and efficient manner. In conventional fan-out wafer level chip scale packages (FO-WLCSP), the signals between the stacked die must be routed through build-up interconnect layers, as well as the through silicon vias (TSV) and through hole vias (THV), which causes long signal paths. The longer signal path reduces the operating speed of the FO-WLCSP. In addition, the build-up interconnect layers are formed across each semiconductor die, even in areas not used for signal routing, which unnecessarily adds manufacturing materials and cost.

Stacking semiconductor die and components often leads to reductions in reliability. During manufacturing of stacked semiconductor die, integrity of components is limited because gaps and space are formed between semiconductor die and build-up layers. One approach for reducing gaps and space is application of underfill material and additional structures between components and build-up layers. However, additional application of structures and material results in reduced manufacturing efficiency and increased costs.

SUMMARY OF THE INVENTION

A need exists for improved reliability with high speed vertical interconnect structures in a WLCSP. Accordingly, in one embodiment, the present invention is a method of making a semiconductor device comprising the steps of providing a semiconductor die, depositing an encapsulant over the semiconductor die, forming an insulating layer over the encapsulant and a first surface of the semiconductor die, disposing a semiconductor component over the insulating layer and first surface of the semiconductor die, and forming a first interconnect structure over the encapsulant and first surface of the semiconductor die to embed the semiconductor component.

In another embodiment, the present invention is a method of making a semiconductor device comprising the steps of providing a semiconductor die, forming an insulating layer over the semiconductor die, disposing a semiconductor component over the insulating layer, and forming an interconnect structure over the insulating layer to embed the semiconductor component.

In another embodiment, the present invention is a semiconductor device comprising a semiconductor die. An insulating layer is formed over a first surface of the semiconductor die. A semiconductor component is disposed over the insulating layer and semiconductor die. A first interconnect structure is formed over the insulating layer to embed the semiconductor component.

In another embodiment, the present invention is a semiconductor device comprising first and second stacked semiconductor die. A first interconnect structure is formed between the first and second stacked semiconductor die. A second interconnect structure is formed over the first and second stacked semiconductor die to embed the second semiconductor die.

BRIEF DESCRIPTION OF THE DRAWINGS

FIGS. 3a-3m illustrate a process of stacking first and second semiconductor die where the second semiconductor die is mounted over the first semiconductor die and embedded in build-up layers;

FIG. 3m illustrates the WLCSP with embedded semiconductor die;

DETAILED DESCRIPTION OF THE DRAWINGS

Figure 1:
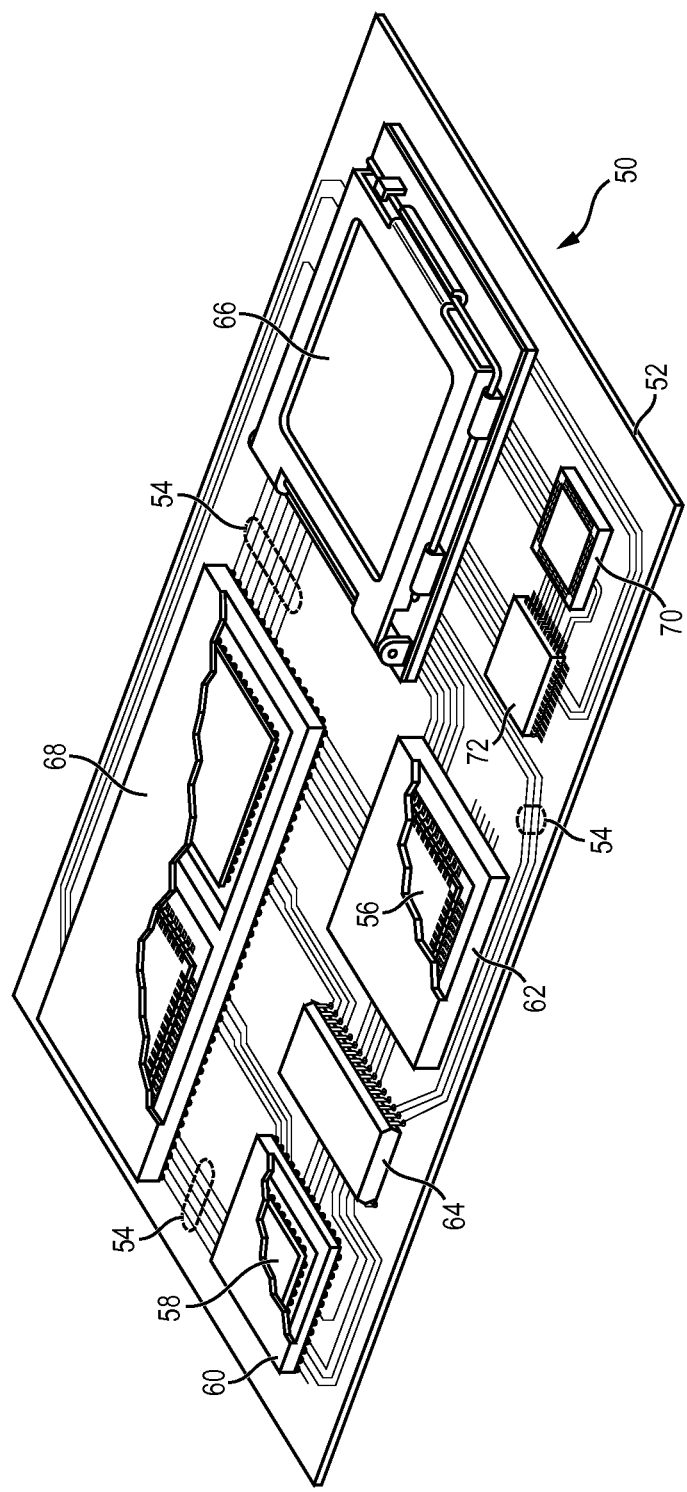
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisoprenes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board PCB 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for the products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
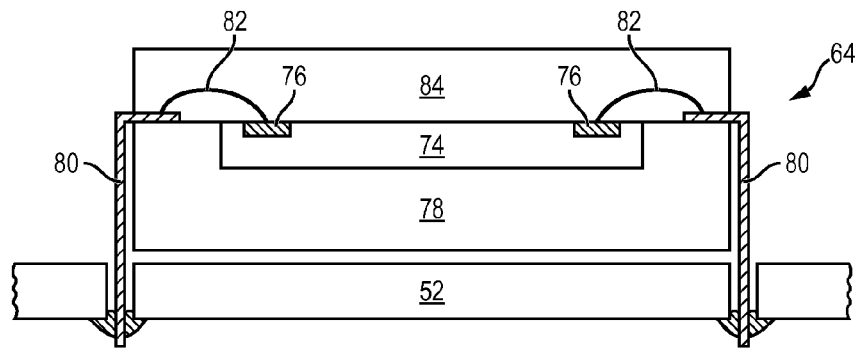
FIGS. 2a-2c illustrate further detail of the representative semiconductor packages mounted to the PCB.
Figure 2B:
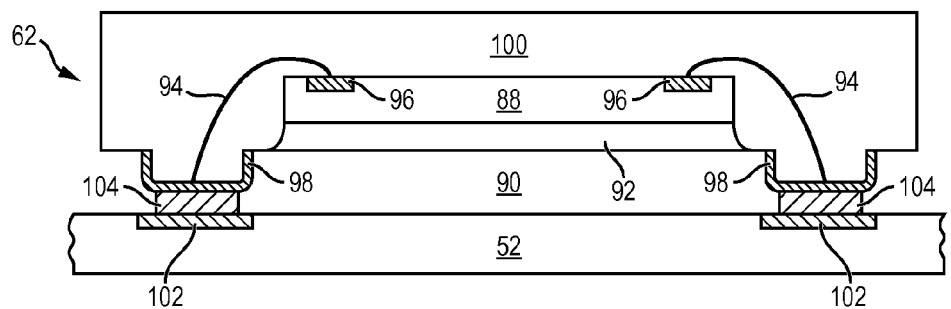
Figure 2C:
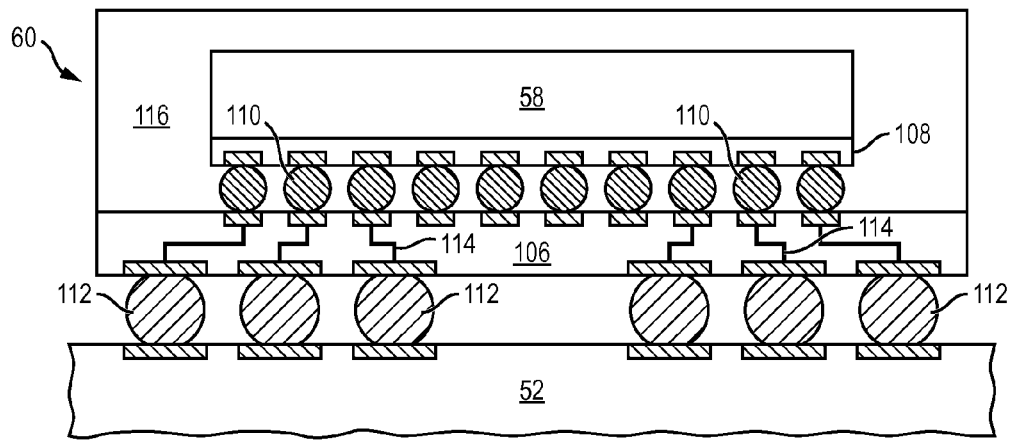

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
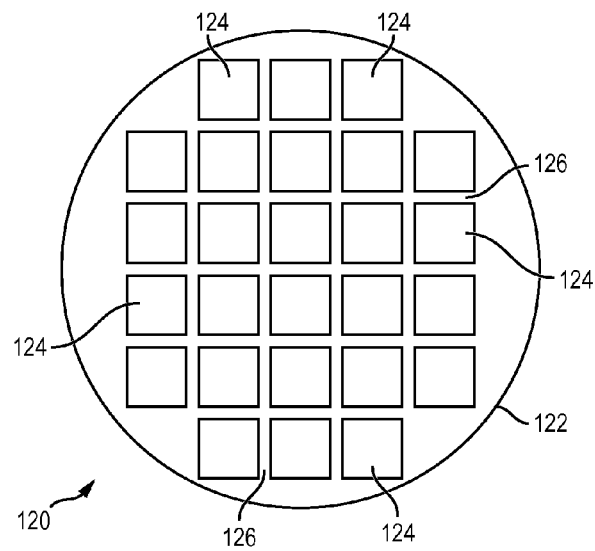

FIGS. 3a-3m illustrate, in relation to FIGS. 1 and 2a-2c, a semiconductor device and method of stacking first and second semiconductor die where the second semiconductor die is disposed over the first semiconductor die and embedded in build-up layers for increased reliability in WLCSP structures. FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
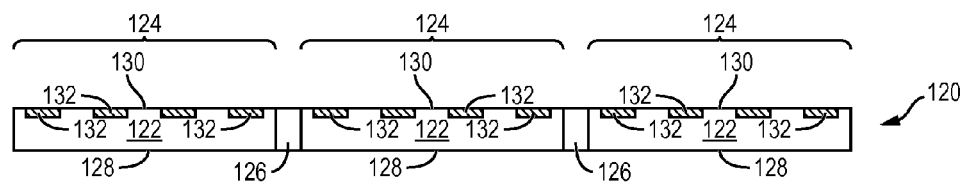

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for radio frequency (RF) signal processing. In some embodiments, semiconductor die 124 includes a packaged semiconductor die. In some embodiments, semiconductor die 124 is a flipchip type device.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

Figure 3C:
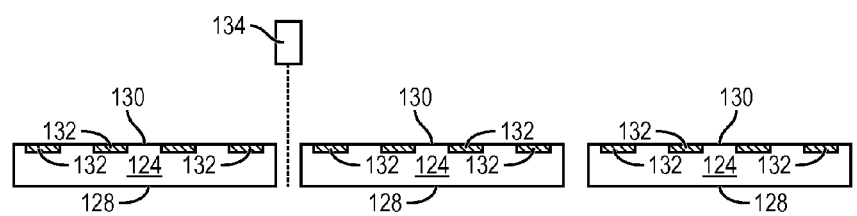

In FIG. 3c, semiconductor wafer 120 is singulated through saw street 126 using a saw blade or laser cutting tool 134 into individual semiconductor die 124.

FIG. 3d shows a substrate or carrier 136 containing temporary or sacrificial base material such as silicon, germanium, gallium arsenide, indium phosphide, silicon carbide, resin, beryllium oxide, glass, or other suitable low-cost, rigid material for structural support. An interface layer or double-sided tape 138 is formed over carrier 136 as a temporary adhesive bonding film, etch-stop layer, or release layer.

In FIG. 3e, semiconductor die 124 from FIG. 3c are mounted to interface layer 138 and over carrier 136 using, for example, a pick and place operation with active surface 130 oriented toward carrier 136.

In FIG. 3f, an encapsulant or molding compound 140 is deposited over semiconductor die 124 using a paste printing, compressive molding, transfer molding, liquid encapsulant molding, vacuum lamination, or other suitable applicator. Encapsulant 140 can be polymer composite material, such as epoxy resin with filler, epoxy acrylate with filler, or polymer with proper filler. Encapsulant 140 is non-conductive, provides physical support, and environmentally protects semiconductor die 124 from external elements and contaminants. Alternatively, encapsulant 140 includes epoxide resins, silica, cresol novolac epoxy, phenol novolac, antimony, bromide, or carbon.

In FIG. 3g, carrier 136 and optional interface layer 138 are removed by chemical etching, mechanical peel-off, chemical mechanical planarization (CMP), mechanical grinding, thermal bake, laser scanning, or wet stripping to expose active surface 130.

Figure 3H:
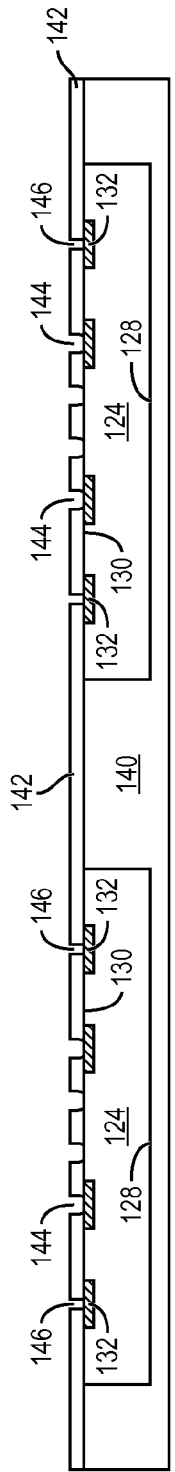

In FIG. 3h, an insulating layer 142, containing one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties is formed over active surface 130 and encapsulant 140. Insulating layer 142 is formed using PVD, CVD, printing, spin coating, spray coating, sintering or thermal oxidation. A portion of insulating layer 142 is removed by an etching process through a patterned photoresist layer to expose openings 144 and 146 over active surface 130. Alternatively, a portion of insulating layer 142 is removed by laser direct ablation (LDA) using laser 143.

Figure 3I:
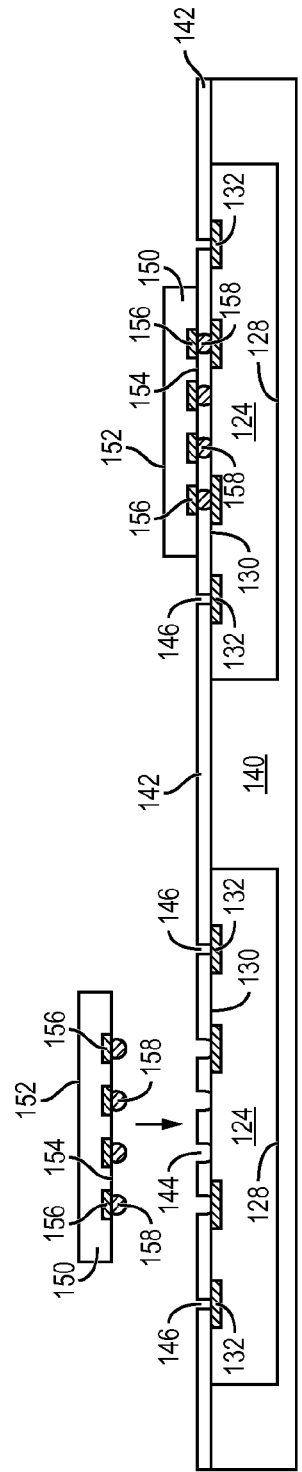

FIG. 3i shows semiconductor die or semiconductor die components 150, singulated from a semiconductor wafer similar to FIGS. 3a-3c, with a back surface 152 and active surface 154 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 154 to implement analog circuits or digital circuits, such as a DSP, ASIC, memory, or other signal processing circuit. Semiconductor die 150 may also contain IPDs, such as inductors, capacitors, and resistors, for RF signal processing.

An electrically conductive layer 156 is formed over active surface 154 using PVD, CVD, electrolytic plating, electroless plating process, or other suitable metal deposition process. Conductive layer 156 can be one or more layers of Al, Cu, Sn, Ni, Au, Ag, Ti, W, Pd, Pt, or other suitable electrically conductive material. Conductive layer 156 operates as contact pads 156 electrically connected to the circuits on active surface 154. Conductive layer 156 can be formed as contact pads 156 disposed side-by-side a first distance from the edge of semiconductor die 150. Alternatively, conductive layer 156 can be formed as contact pads that are offset in multiple rows such that a first row of contact pads is disposed a first distance from the edge of the die, and a second row of contact pads alternating with the first row is disposed a second distance from the edge of the die.

An electrically conductive bump material 158 is deposited over conductive layer 156 using an evaporation, electrolytic plating, electroless plating, ball drop, or screen printing process. Bump material 158 can be Al, Sn, Ni, Au, Ag, Pb, bismuth (Bi), Cu, solder, and combinations thereof, with an optional flux solution. For example, bump material 158 can be eutectic Sn/Pb, high-lead solder, or lead-free solder. Bump material is bonded to conductive layer 156 using a suitable attachment or bonding process. In some embodiments, the bump material is reflowed by heating the material above its melting point to form spherical balls or bumps 158. In some applications, bumps 158 are reflowed a second time to improve electrical contact to conductive layer 156. In some embodiments, bumps 158 are formed over an under bump metallization (UBM) having a wetting layer, barrier layer, and adhesive layer. The bumps can also be compression bonded or thermocompression bonded to conductive layer 156. Bumps 158 represent one type of interconnect structure that can be formed over conductive layer 156. The interconnect structure can also use bond wires, conductive paste, stud bump, micro bump, or other electrical interconnect.

Semiconductor die 150 is positioned over and mounted to semiconductor die 124 using a pick and place operation with active surface 154 oriented toward active surface 130. Openings 144 in insulating layer 142 receive bumps 158. In some embodiments, bumps 158 are reflowed to improve electrical contact to contact pads 132 of active surface 130. Bumps 158 provide the electrical connection between semiconductor die 150 and semiconductor die 124. Alternatively, an electrically conductive layer or redistribution layer (RDL) is formed in openings 144 using a patterning and metal deposition process such as printing, PVD, CVD, sputtering, electrolytic plating, and electroless plating. Conductive layer can be one or more layers of Al, Cu, Sn, Ni, Au, Ag, or other suitable electrically conductive material. In some embodiments, conductive layer comprises conductive vias. Conductive layer can also comprise bond wires, conductive paste, stud bump, micro bump, or other electrical interconnect. Alternatively, a plurality of bumps 158 is formed in openings 144 or 146 in insulating layer 142 over semiconductor die 124 such that semiconductor die 150 does not have bumps 158. Accordingly, semiconductor die 150 are mounted to bumps 158 preformed in openings 144 and contact pads 156 are electrically and physically connected to bumps 158. Alternatively, a plurality of bumps 158 is formed on semiconductor die 124. In this case, insulating layer 142 and openings 144 are formed on semiconductor die 150.

The combination of bumps 158 and insulating layer 142 between active surface 130 and semiconductor die 150 reduces gaps or space between active surface 130 and semiconductor die 150.

Figure 3J:
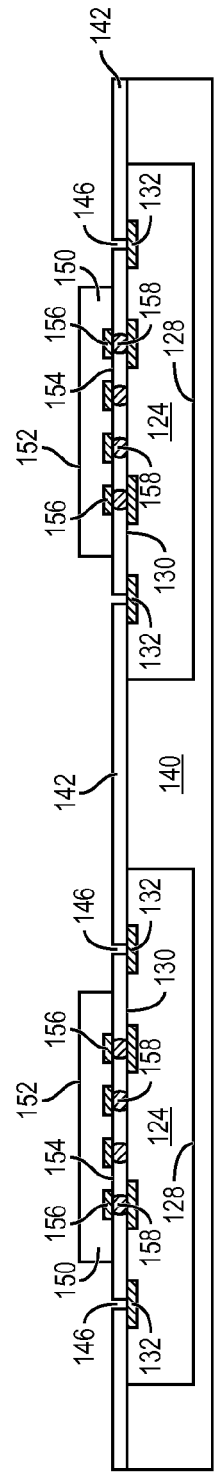

FIG. 3j shows semiconductor die 150 mounted and electrically connected to semiconductor die 124 via bumps 158. Insulating layer 142 and bumps 158 reduce space between active surface 130 and active surface 154.

Figure 3K:
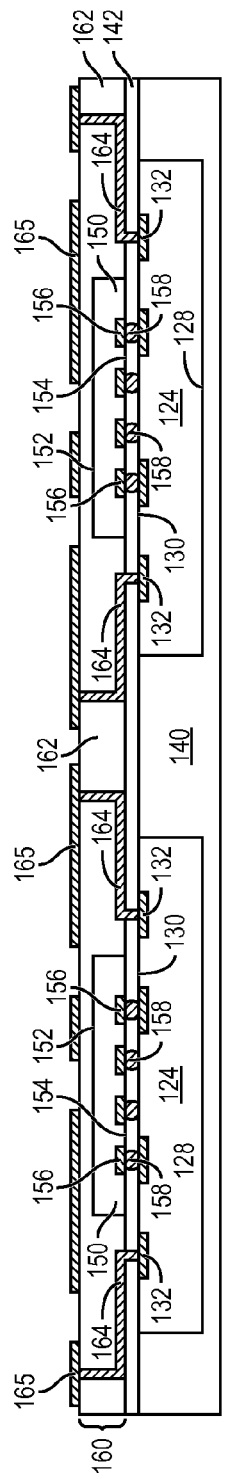

In FIG. 3k, a build-up interconnect structure 160 is formed over semiconductor die 124, insulating layer 142, and encapsulant 140 and interconnect structure 160 embeds semiconductor die 150. Interconnect structure 160 includes an insulating or passivation layer 162 containing one or more layers of SiO2, Si3N4, SiON, Ta2O5, Al2O3, or other material having similar insulating and structural properties. Insulating layer 162 is formed using PVD, CVD, printing, spin coating, spray coating, sintering or thermal oxidation. Overall reliability is enhanced by mounting semiconductor die 150 and subsequently embedding semiconductor die 150 with interconnect structure 160. Semiconductor die 150 embedded with interconnect structure 160 increases structural security and protection from external environment. Interconnect structure 160 reduces gaps and space between semiconductor die 150 and interconnect structure 160. Further, gaps and space between semiconductor die 124 and semiconductor die 150 are reduced because bumps 158 and insulating layer 142 occupy a portion of the space between semiconductor die 124 and semiconductor die 150.

Interconnect structure 160 further includes a first electrically conductive layer 164 formed in insulating layer 162 using a patterning and metal deposition process such as PVD, CVD, sputtering, electrolytic plating, and electroless plating. Conductive layer 164 can be one or more layers of Al, Cu, Sn, Ni, Au, Ag, or other suitable electrically conductive material. In some embodiments, a portion of conductive layer 164 is electrically connected to contact pads 132 of semiconductor die 124 through openings 146. Other portions of conductive layer 164 can be electrically common or electrically isolated depending on the design and function of the semiconductor device.

Interconnect structure 160 further includes a second electrically conductive layer 165 formed over insulating layer 162 using a patterning and metal deposition process such as PVD, CVD, sputtering, electrolytic plating, and electroless plating. Conductive layer 165 can be one or more layers of Al, Cu, Sn, Ni, Au, Ag, or other suitable electrically conductive material. In some embodiments, a portion of conductive layer 165 is electrically connected to conductive layer 164. Other portions of conductive layer 165 can be electrically common or electrically isolated depending on the design and function of the semiconductor device.

Figure 3L:
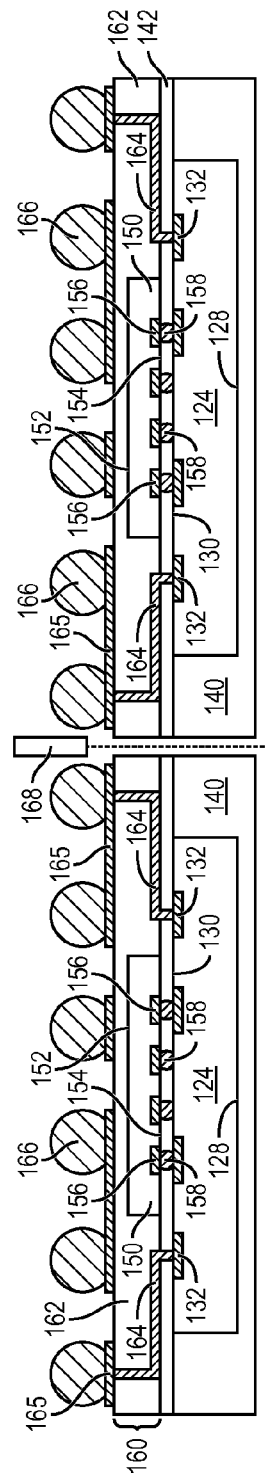

In FIG. 3l, an electrically conductive bump material 166 is deposited over build-up interconnect structure 160 and conductive layer 165 and electrically connected to conductive layer 165 using an evaporation, electrolytic plating, electroless plating, ball drop, or screen printing process. Bump material 166 can be Al, Sn, Ni, Au, Ag, Pb, Bi, Cu, solder, and combinations thereof, with an optional flux solution. For example, bump material 166 can be eutectic Sn/Pb, high-lead solder, or lead-free solder. Bump material 166 is bonded to conductive layer 165 using a suitable attachment or bonding process. In one embodiment, bump material 166 is reflowed by heating the material above its melting point to form spherical balls or bumps 166. In some applications, bumps 166 are reflowed a second time to improve electrical contact to conductive layer 165. The bumps can also be compression bonded to conductive layer 165. Bumps 166 represent one type of interconnect structure that can be formed over conductive layer 165. The interconnect structure can also use bond wires, stud bump, micro bump, or other electrical interconnect. Semiconductor die 124 are singulated with saw blade or laser cutting device 168 into individual semiconductor devices.

Figure 3M:
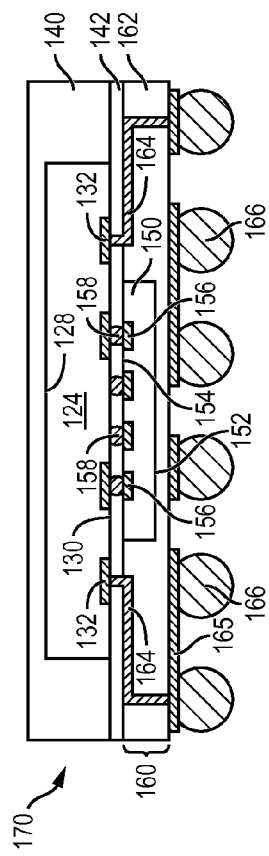

FIG. 3m shows WLCSP 170 with embedded die after singulation. Semiconductor die 150 is disposed over active surface 130 with bumps 158 and insulating material 142 reducing space between active surface 130 of semiconductor die 124 and active surface 154 of semiconductor die 150. By electrically connecting semiconductor die 124 and semiconductor die 150 with bumps 158, separation between the die is reduced resulting in a short and efficient signal path to improve electrical performance and increase operating speed of WLCSP 170 with embedded die. WLCSP 170 with embedded die provides enhanced reliability. Semiconductor die 150 is embedded in interconnect structure 160 to shield semiconductor die 150 from external environment. WLCSP 170 with embedded die does not require underfill material between semiconductor die 124 and semiconductor die 150. WLCSP 170 with embedded die reduces the existence of space or gaps between semiconductor die 150 and build-up layers.

Figure 4:
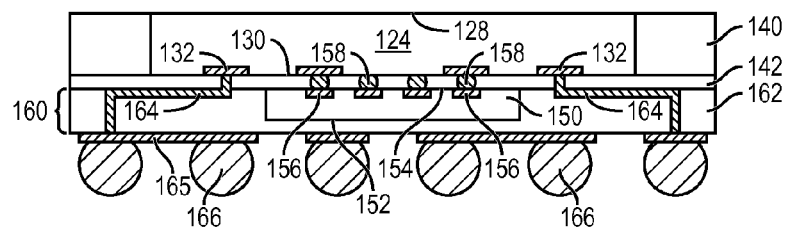
FIG. 4 illustrates exposed first semiconductor die application.

In FIG. 4, a portion of encapsulant 140 is removed by an exposure or development process, LDA, etching, or other suitable process to expose back surface 128 of semiconductor die 124.

Figure 5A:
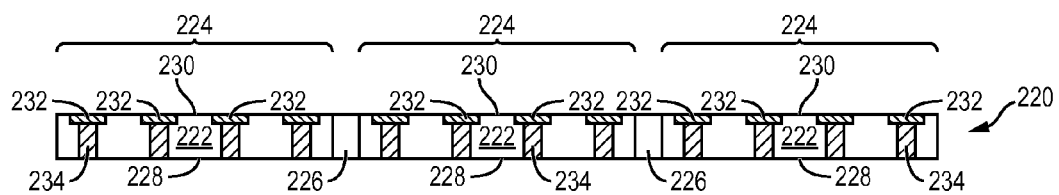
FIGS. 5a-5n illustrate a process of stacking first and second semiconductor die where the second semiconductor die is mounted over the first semiconductor die and embedded in build-up layers including first semiconductor TSVs for further connection to other semiconductor components.
Figure 5B:
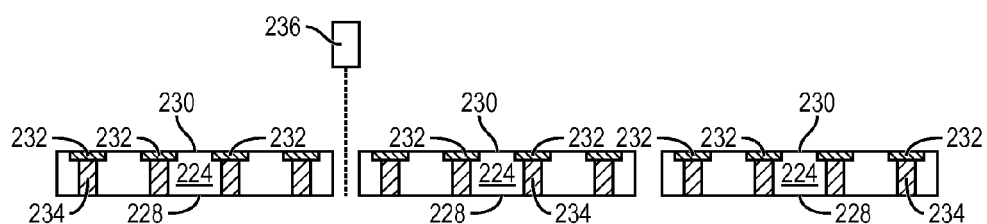
Figure 5C:
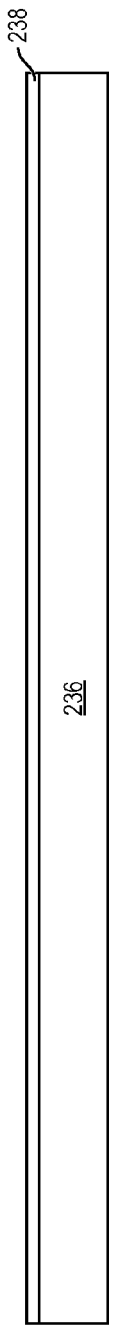
Figure 5D:
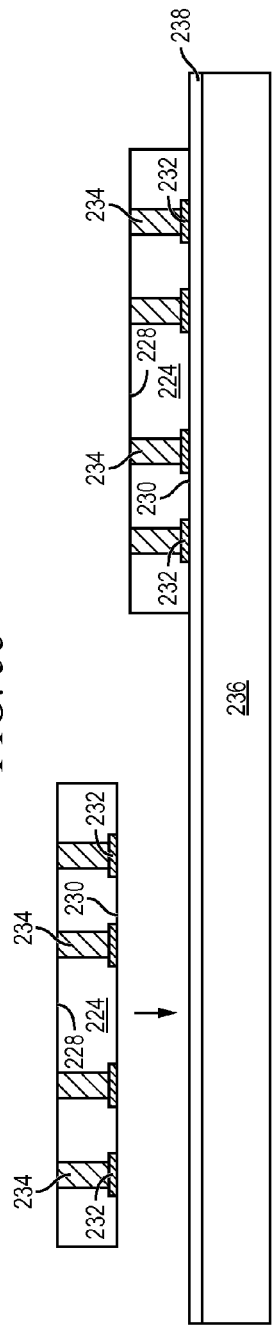
Figure 5E:
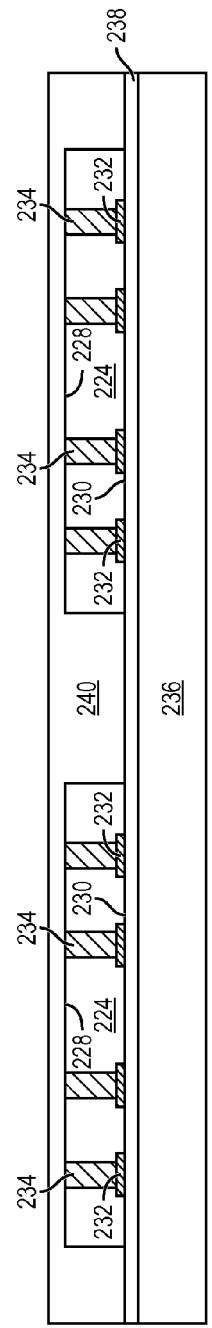
Figure 5F:
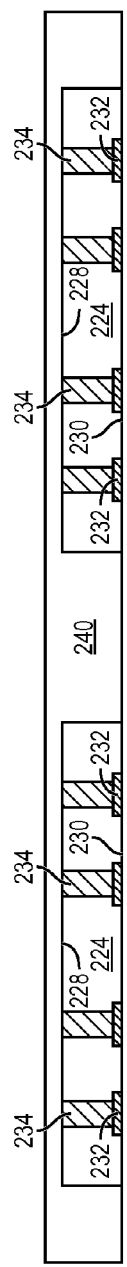
Figure 5G:
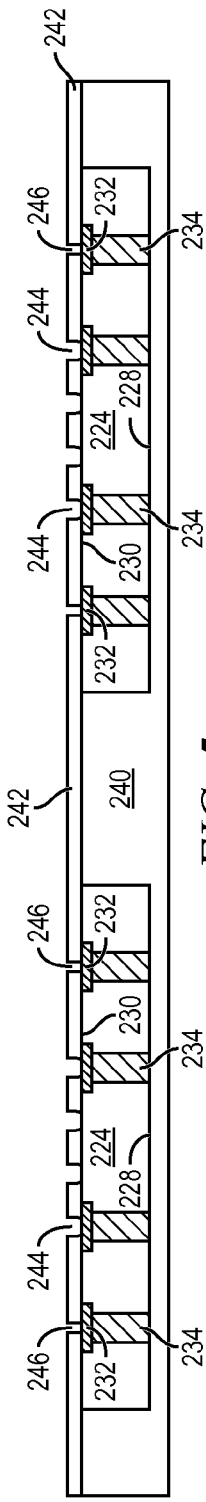
Figure 5H:
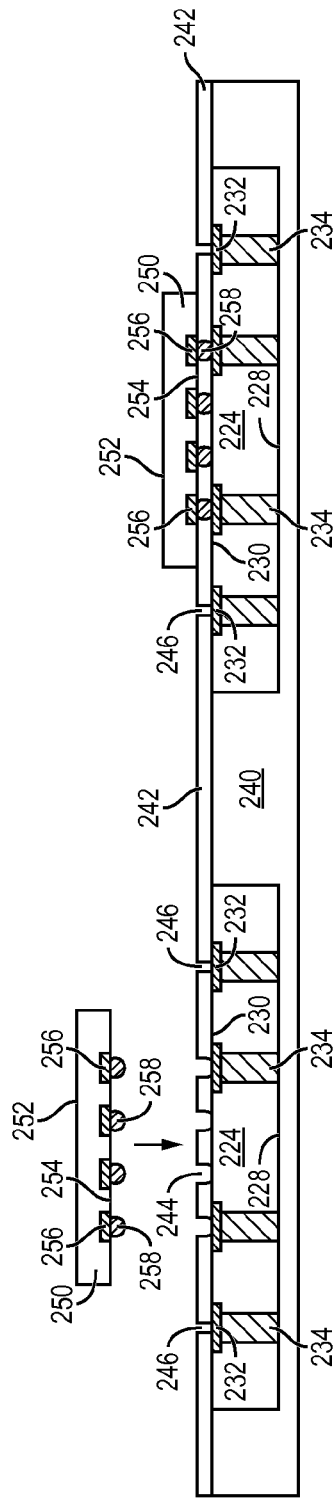
Figure 5I:
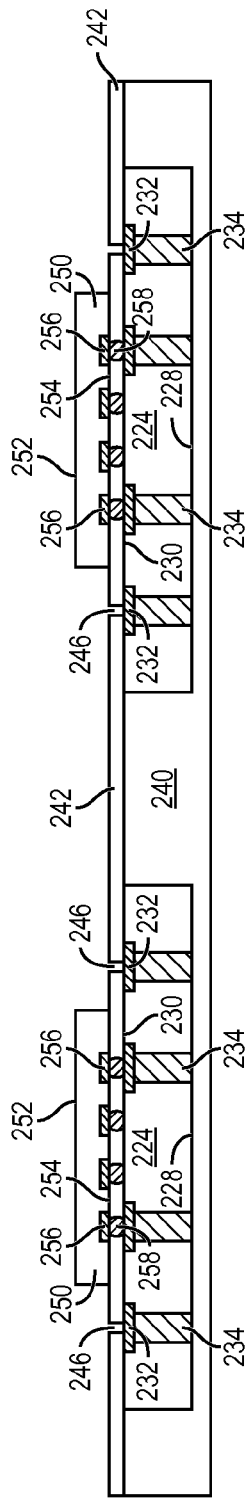
Figure 5J:
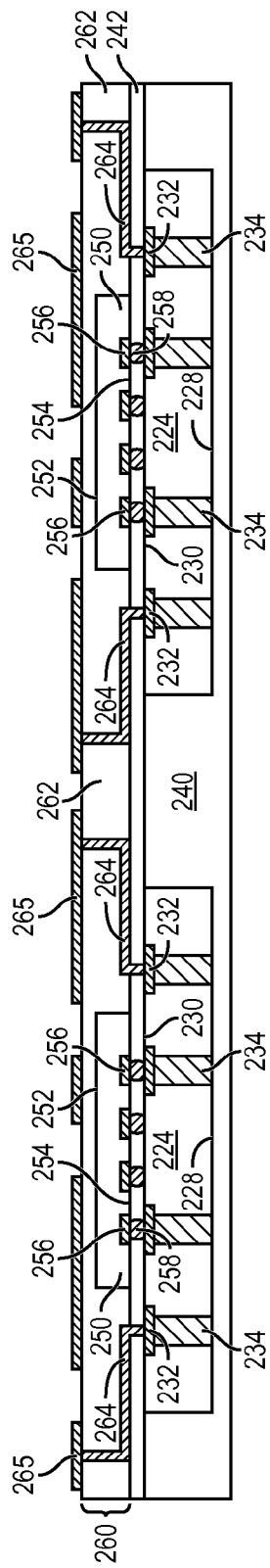
Figure 5K:
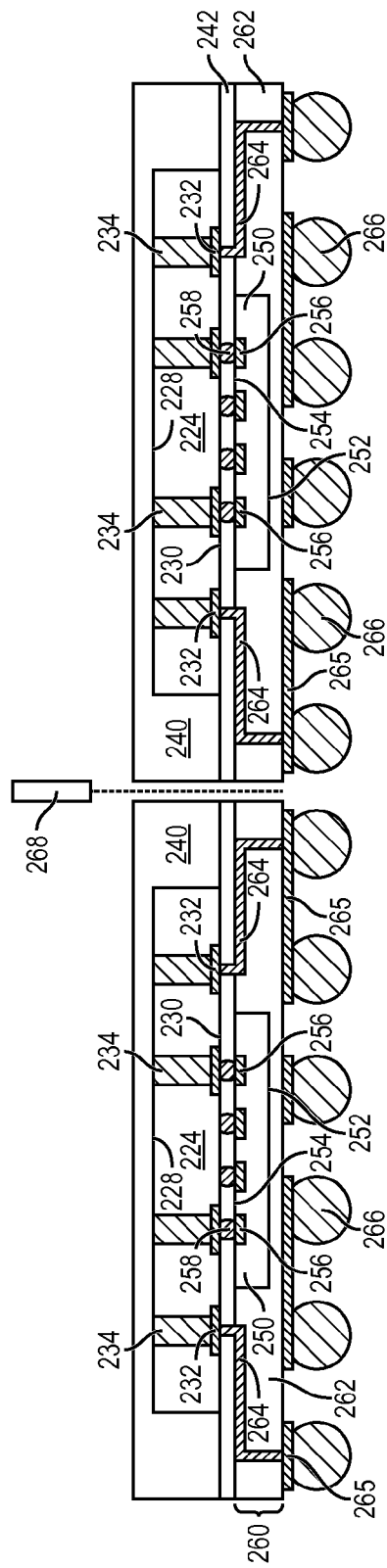
Figure 5L:
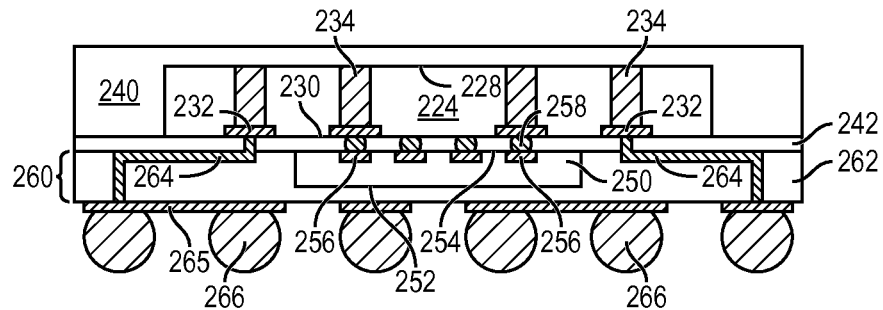
Figure 5M:
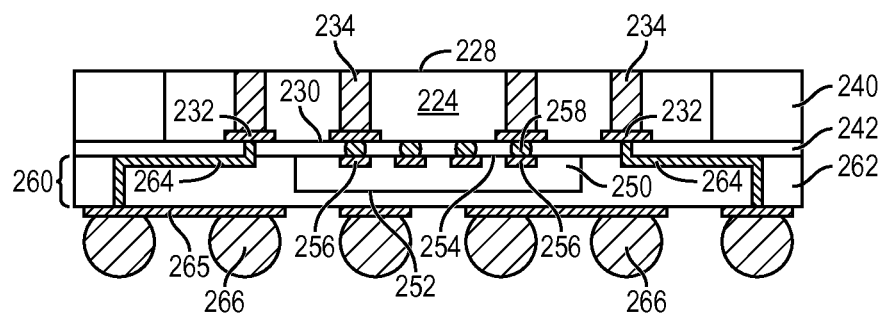
Figure 5N:
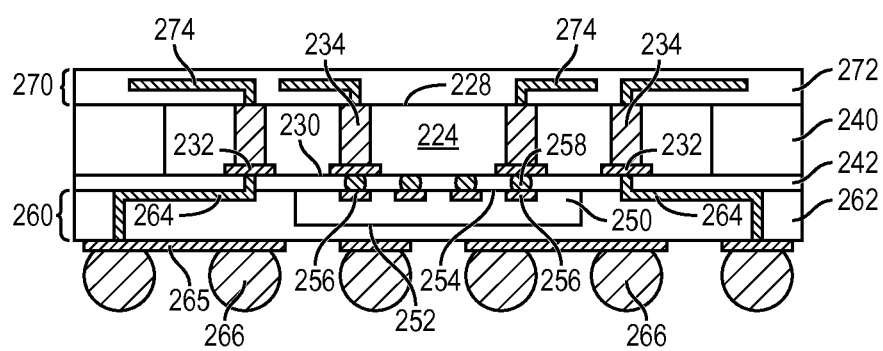

FIGS. 5a-5n illustrate, in relation to FIGS. 1 and 2a-2c, a process of stacking first and second semiconductor die where the second semiconductor die is disposed over the first semiconductor die and embedded in build-up layers in a WLCSP structure. Conductive TSVs are formed in the first semiconductor die to provide further connection to the second semiconductor die.

FIG. 5a, continuing from FIG. 3c, shows a cross-sectional view of a portion of semiconductor wafer 220 with a base substrate material 222, such as silicon, germanium, gallium arsenide, indium phosphide, or silicon carbide, for structural support. Each semiconductor die 224 has a back surface 228 and active surface 230. In some embodiments, active surface 230 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 230 to implement analog circuits or digital circuits, such as DSP, ASIC, memory, or other signal processing circuit. Semiconductor die 224 may include discrete devices. Discrete devices can be active devices, such as transistors and diodes, or passive devices, such as capacitors, resistors, and inductors for RF signal processing. Semiconductor die 224 may also include a packaged semiconductor die. In one embodiment, semiconductor die 224 is a flipchip type device.

An electrically conductive layer 232 is formed over active surface 230 using PVD, CVD, electrolytic plating, electroless plating process, or other suitable metal deposition process. Conductive layer 232 can be one or more layers of Al, Cu, Sn, Ni, Au, Ag, or other suitable electrically conductive material. Conductive layer 232 operates as contact pads electrically connected to the circuits on active surface 230. Conductive layer 232 can be formed as contact pads disposed side-by-side a first distance from the edge of semiconductor die 224, as shown in FIG. 5a. Alternatively, conductive layer 232 can be formed as contact pads that are offset in multiple rows such that a first row of contact pads is disposed a first distance from the edge of the die, and a second row of contact pads alternating with the first row is disposed a second distance from the edge of the die.

FIG. 5a further shows a plurality of vias 234 formed in semiconductor die 224 using laser drilling, mechanical drilling, or deep reactive ion etching (DRIE). Vias 234 are filled with Al, Cu, Sn, Ni, Au, Ag, titanium (Ti), tungsten (W), poly-silicon, or other suitable electrically conductive material using electrolytic plating, electroless plating process, or other suitable metal deposition process to form conductive TSVs 234.

In FIG. 5b, semiconductor wafer 220 is singulated through saw street 226 using a saw blade or laser cutting tool 236 into individual semiconductor die 224.

In FIG. 5c, a substrate or carrier 236 is provided containing temporary or sacrificial base material such as silicon, germanium, gallium arsenide, indium phosphide, silicon carbide, resin, beryllium oxide, glass, or other suitable low-cost, rigid material for structural support. An interface layer or double-sided tape 238 is formed over carrier 236 as a temporary adhesive bonding film, etch-stop layer, or release layer.

In FIG. 5d, semiconductor die 224 from FIG. 5b are mounted to interface layer 238 and over carrier 236 using, for example, a pick and place operation with active surface 230 oriented toward carrier 236.

In FIG. 5e, an encapsulant or molding compound 240 is deposited over semiconductor die 224 using a paste printing, compressive molding, transfer molding, liquid encapsulant molding, vacuum lamination, or other suitable applicator. Encapsulant 240 can be polymer composite material, such as epoxy resin with filler, epoxy acrylate with filler, or polymer with proper filler. Encapsulant 240 is non-conductive, provides physical support, and environmentally protects semiconductor die 224 from external elements and contaminants. Alternatively, encapsulant 240 includes epoxide resins, silica, cresol novolac epoxy, phenol novolac, antimony, bromide, or carbon.

In FIG. 5f, carrier 236 and optional interface layer 238 are removed by chemical etching, mechanical peel-off, CMP, mechanical grinding, thermal bake, laser scanning, or wet stripping to expose active surface 230.

In FIG. 5g, an insulating layer 242 containing one or more layers of SiO2, Si3N4, SiON, Ta2O5, Al2O3, or other material having similar insulating and structural properties is formed over active surface 230 and encapsulant 240. Insulating layer 242 is formed using PVD, CVD, printing, spin coating, spray coating, sintering or thermal oxidation. A portion of insulating layer 242 is removed by an etching process through a patterned photoresist layer to expose openings 244 and 246 over active surface 230. Alternatively, a portion of insulating layer 242 is removed by LDA using laser 243.

FIG. 5h shows semiconductor die or semiconductor die components 250, singulated from a semiconductor wafer similar to FIGS. 5a-5c, with a back surface 252 and active surface 254 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 254 to implement analog circuits or digital circuits, such as a DSP, ASIC, memory, or other signal processing circuit. Semiconductor die 250 may also contain IPDs, such as inductors, capacitors, and resistors, for RF signal processing.

An electrically conductive layer 256 is formed over active surface 254 using PVD, CVD, electrolytic plating, electroless plating process, or other suitable metal deposition process. Conductive layer 256 can be one or more layers of Al, Cu, Sn, Ni, Au, Ag, Ti, W, Pd, Pt, or other suitable electrically conductive material. Conductive layer 256 operates as contact pads 256 electrically connected to the circuits on active surface 254. Conductive layer 256 can be formed as contact pads 256 disposed side-by-side a first distance from the edge of semiconductor die 250. Alternatively, conductive layer 256 can be formed as contact pads that are offset in multiple rows such that a first row of contact pads is disposed a first distance from the edge of the die, and a second row of contact pads alternating with the first row is disposed a second distance from the edge of the die.

An electrically conductive bump material 258 is deposited over conductive layer 256 using an evaporation, electrolytic plating, electroless plating, ball drop, or screen printing process. Bump material 258 can be Al, Sn, Ni, Au, Ag, Pb, Bi, Cu, solder, and combinations thereof, with an optional flux solution. For example, the bump material can be eutectic Sn/Pb, high-lead solder, or lead-free solder. Bump material 258 is bonded to conductive layer 256 using a suitable attachment or bonding process. In one embodiment, the bump material is reflowed by heating the material above its melting point to form spherical balls or bumps 258. In some applications, bumps 258 are reflowed a second time to improve electrical contact to conductive layer 256. In one embodiment, bumps 258 are formed over a UBM having a wetting layer, barrier layer, and adhesive layer. The bumps can also be compression bonded or thermocompression bonded to conductive layer 256. Bumps 258 represent one type of interconnect structure that can be formed over conductive layer 256. The interconnect structure can also use bond wires, conductive paste, stud bump, micro bump, or other electrical interconnect.

Semiconductor die 250 is positioned over and mounted to semiconductor die 224 using a pick and place operation with active surface 254 oriented toward active surface 230. Openings 244 in insulating layer 242 receive bumps 258. In some embodiments, bumps 258 are reflowed to improve electrical contact to contact pads 232 of active surface 230. Bumps 258 provide the electrical connection between semiconductor die 250 and semiconductor die 224. Alternatively, an electrically conductive layer or RDL is formed in openings 244 using a patterning and metal deposition process such as printing, PVD, CVD, sputtering, electrolytic plating, and electroless plating. The conductive layer can be one or more layers of Al, Cu, Sn, Ni, Au, Ag, or other suitable electrically conductive material. In some embodiments, the conductive layer comprises conductive vias. The conductive layer can comprise bond wires, conductive paste, stud bump, micro bump, or other electrical interconnect. Alternatively, a plurality of bumps 258 is formed in openings 244 or 246 in insulating layer 242 such that semiconductor die 250 does not have bumps 258. Accordingly, semiconductor die 250 are mounted to bumps 258 preformed in openings 244 and contact pads 256 are electrically and physically connected to bumps 258.

The combination of bumps 258 and insulating layer 242 between active surface 230 and semiconductor die 250 reduces space between active surface 230 and semiconductor die 250.

FIG. 5i shows semiconductor die 250 mounted and electrically connected to semiconductor die 224 via bumps 258. Insulating layer 242 and bumps 258 reduce space between active surface 230 and active surface 254. In some embodiments, TSVs 234 of semiconductor die 224 are aligned with contact pads 256 and bumps 258 through openings 244. TSVs 234 provide further electrical connection between semiconductor die 224 and semiconductor die 250.

In FIG. 5j, a build-up interconnect structure 260 is formed over semiconductor die 224, insulating layer 242, and encapsulant 240 and interconnect structure 260 embeds semiconductor die 250. Interconnect structure 260 includes an insulating or passivation layer 262 containing one or more layers of SiO2, Si3N4, SiON, Ta2O5, Al2O3, or other material having similar insulating and structural properties. Insulating layer 262 is formed using PVD, CVD, printing, spin coating, spray coating, sintering or thermal oxidation. Overall reliability is enhanced by mounting semiconductor die 250 and subsequently embedding semiconductor 250 with interconnect structure 260. Semiconductor die 250 embedded in interconnect structure 260 increases structural security and protection from external environment. Interconnect structure 260 reduces gaps and space between semiconductor die 250 and interconnect structure 260. Further, gaps and space between semiconductor die 224 and semiconductor die 250 are reduced because bumps 258 and insulating layer 242 occupy a portion of the space between semiconductor die 224 and semiconductor die 250.

Interconnect structure 260 further includes a first electrically conductive layer 264 formed in insulating layer 262 using a patterning and metal deposition process such as PVD, CVD, sputtering, electrolytic plating, and electroless plating. Conductive layer 264 can be one or more layers of Al, Cu, Sn, Ni, Au, Ag, or other suitable electrically conductive material. One portion of conductive layer 264 is electrically connected to contact pads 232 of semiconductor die 224 through openings 246. Other portions of conductive layer 264 can be electrically common or electrically isolated depending on the design and function of the semiconductor device.

Build-up interconnect structure 260 further includes a second electrically conductive layer 265 formed over insulating layer 262 using a patterning and metal deposition process such as PVD, CVD, sputtering, electrolytic plating, and electroless plating. Conductive layer 265 can be one or more layers of Al, Cu, Sn, Ni, Au, Ag, or other suitable electrically conductive material. One portion of conductive layer 265 is electrically connected to conductive layer 264. Other portions of conductive layer 265 can be electrically common or electrically isolated depending on the design and function of the semiconductor device.

In FIG. 5k, an electrically conductive bump material 266 is deposited over build-up interconnect structure 260 and conductive layer 265 and electrically connected to conductive layer 265 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 265 using a suitable attachment or bonding process. In one embodiment, the bump material is reflowed by heating the material above its melting point to form spherical balls or bumps 266. In some applications, bumps 266 are reflowed a second time to improve electrical contact to conductive layer 265. The bumps can also be compression bonded to conductive layer 265. Bumps 266 represent one type of interconnect structure that can be formed over conductive layer 265. The interconnect structure can also use bond wires, stud bump, micro bump, or other electrical interconnect. Semiconductor die 224 are singulated with saw blade or laser cutting device 268 into individual semiconductor devices.

FIG. 5l shows WLCSP with embedded die after singulation and with TSV application for further connection to additional devices or components. Semiconductor die 250 is mounted to active surface 230 with bumps 258 and insulating material 242 reducing space between active surface 230 of semiconductor die 224 and active surface 254 of semiconductor die 250. By electrically connecting semiconductor die 224 and 250 with bumps 258, the separation between the die is reduced resulting in a short and efficient signal path to improve electrical performance and increase operating speed of WLCSP with embedded die. WLCSP with embedded die provides enhanced reliability. Semiconductor die 250 is embedded in build-up layers to shield semiconductor die 250 from external environment. WLCSP with embedded die does not require underfill material between semiconductor die 224 and semiconductor die 250. WLCSP with embedded die reduces the existence of space or gaps between semiconductor and build-up layers.

In FIG. 5m, encapsulant 240 is thinned in a subsequent backgrinding step. Encapsulant 240 can be thinned such that the encapsulant is coplanar with back surface 228 and does not cover the back surface. A chemical etch can also be used to planarize encapsulant 240 with back surface 228.

In FIG. 5n, a second build-up interconnect structure 270 is formed over back surface 228, encapsulant 240, and TSVs 234. Interconnect structure 270 includes an insulating or passivation layer 272 containing one or more layers of SiO2, Si3N4, SiON, Ta2O5, Al2O3, or other material having similar insulating and structural properties. The insulating layer 272 is formed using PVD, CVD, printing, spin coating, spray coating, sintering or thermal oxidation.

Interconnect structure 270 further includes an electrically conductive layer 274 formed in insulating layer 272 using a patterning and metal deposition process such as PVD, CVD, sputtering, electrolytic plating, and electroless plating. Conductive layer 274 can be one or more layers of Al, Cu, Sn, Ni, Au, Ag, or other suitable electrically conductive material. In some embodiments, a portion of conductive layer 274 is electrically connected to TSVs 234. Other portions of conductive layer 274 can be electrically common or electrically isolated depending on the design and function of the semiconductor device.

Figure 6A:
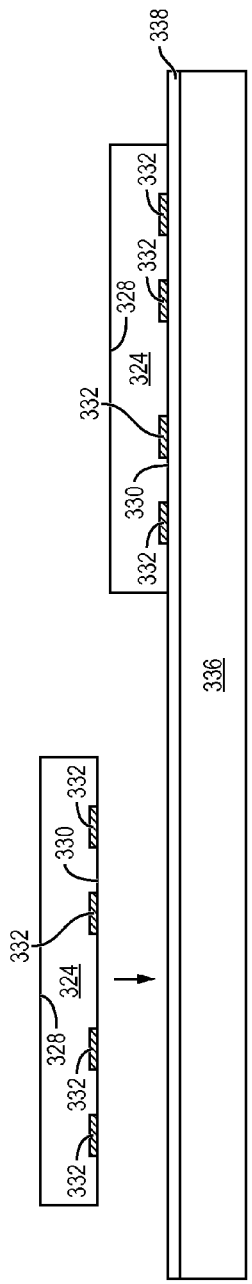
FIGS. 6a-6n illustrate a process of stacking first and second semiconductor die where the second semiconductor die is mounted over the first semiconductor die and embedded in build-up layers including z-interconnects and additional build-up layers application for stacking additional semiconductor components over the WLCSP.
Figure 6B:
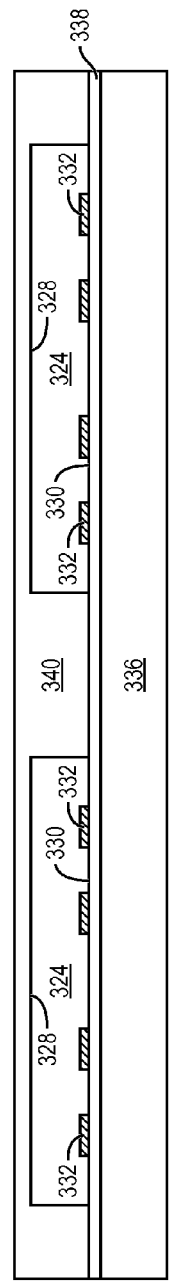
Figure 6C:
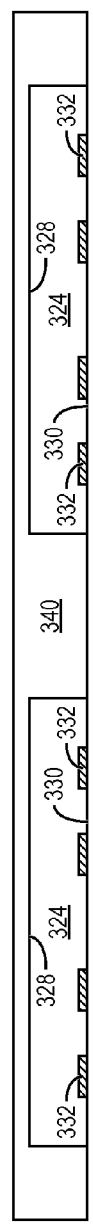
Figure 6D:
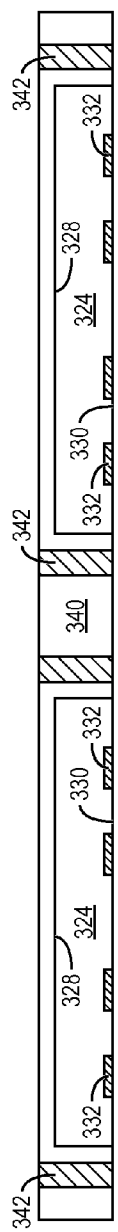
Figure 6E:
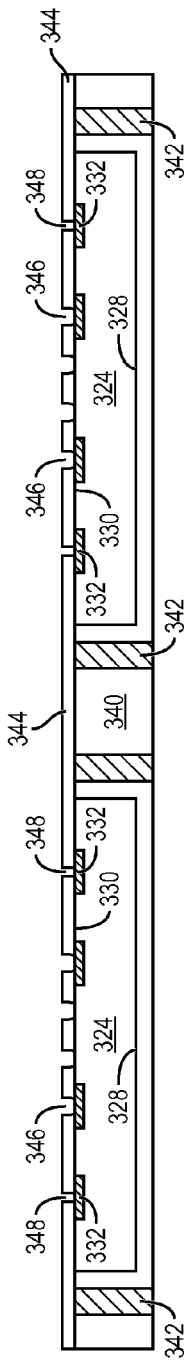
Figure 6F:
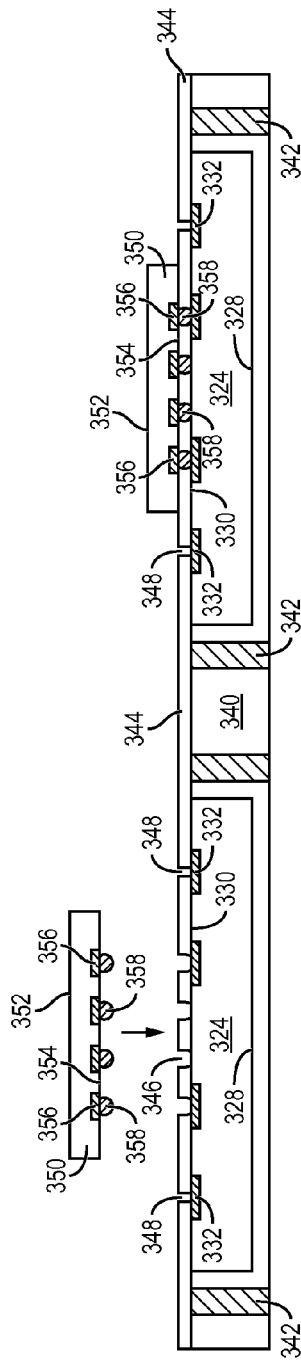
Figure 6G:
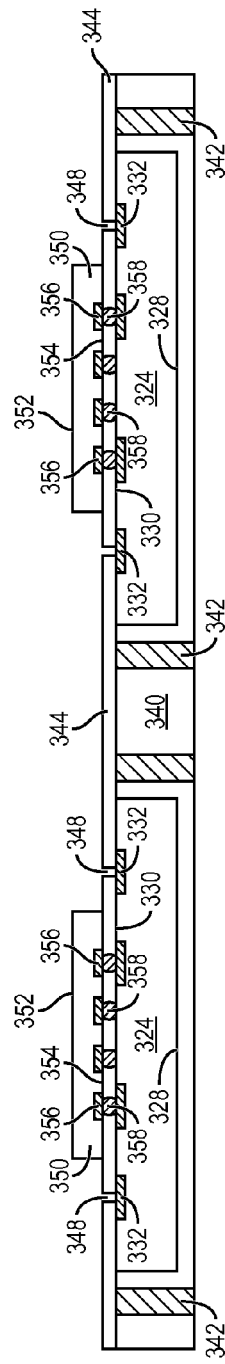
Figure 6K:
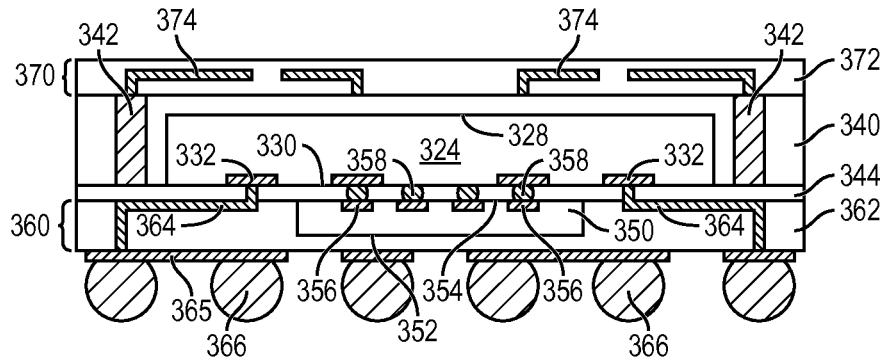
Figure 6L:
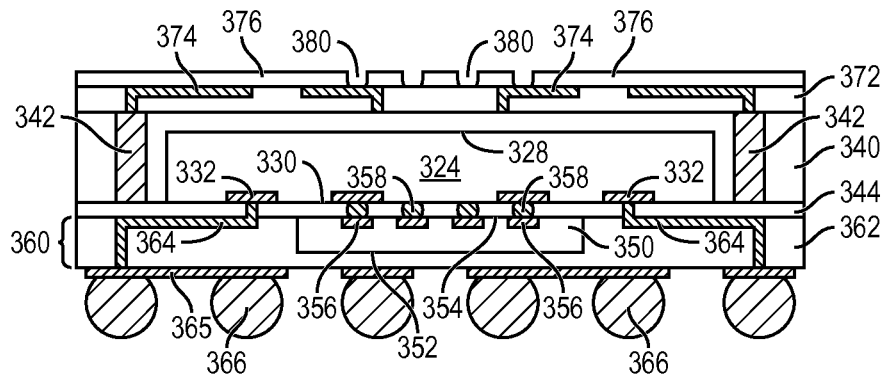
Figure 6M:
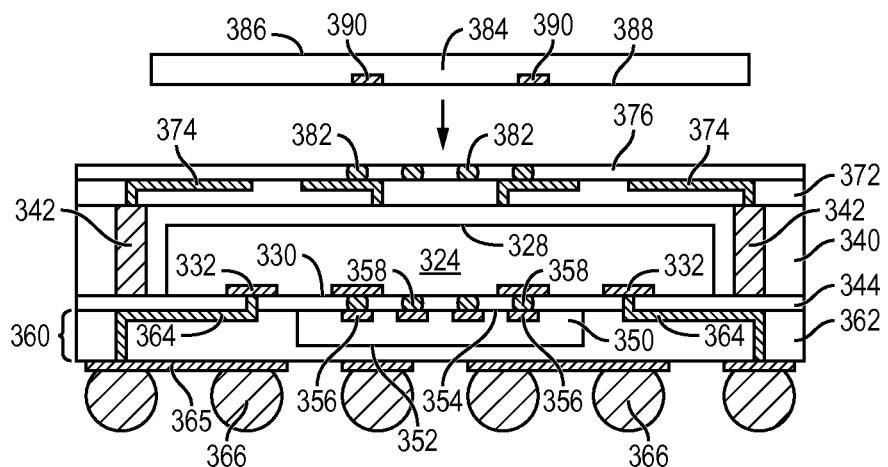
Figure 6N:
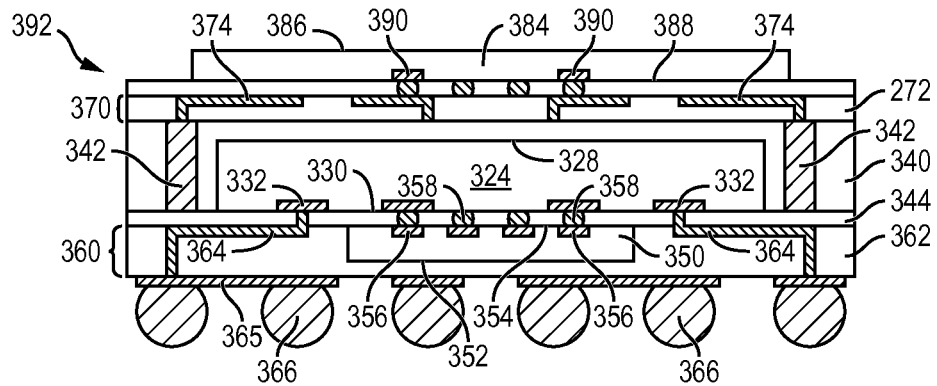

FIGS. 6a-6n illustrate, in relation to FIGS. 1, 2a-2c, and 3a-3d, a process of stacking first and second semiconductor die where the second semiconductor die is disposed over the first semiconductor die and embedded in build-up layers in a WLCSP structure. Z-interconnects and additional build-up layers are applied for stacking additional semiconductor components over the WLCSP.

FIG. 6a, continuing from FIG. 3c, shows semiconductor die 324 after singulation. Each semiconductor die 324 has a back surface 328 and active surface 330. In some embodiments, active surface 330 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 330 to implement analog circuits or digital circuits, such as DSP, ASIC, memory, or other signal processing circuit. Semiconductor die 324 may include discrete devices. Discrete devices can be active devices, such as transistors and diodes, or passive devices, such as capacitors, resistors, and inductors for RF signal processing. Semiconductor die 324 may also include a packaged semiconductor die. In one embodiment, semiconductor die 324 is a flipchip type device.

An electrically conductive layer 332 is formed over active surface 330 using PVD, CVD, electrolytic plating, electroless plating process, or other suitable metal deposition process. Conductive layer 332 can be one or more layers of Al, Cu, Sn, Ni, Au, Ag, or other suitable electrically conductive material. Conductive layer 332 operates as contact pads electrically connected to the circuits on active surface 330. Conductive layer 332 can be formed as contact pads disposed side-by-side a first distance from the edge of semiconductor die 324, as shown in FIG. 6a. Alternatively, conductive layer 332 can be formed as contact pads that are offset in multiple rows such that a first row of contact pads is disposed a first distance from the edge of the die, and a second row of contact pads alternating with the first row is disposed a second distance from the edge of the die.

A substrate or carrier 336 is provided containing temporary or sacrificial base material such as silicon, germanium, gallium arsenide, indium phosphide, silicon carbide, resin, beryllium oxide, glass, or other suitable low-cost, rigid material for structural support. An interface layer or double-sided tape 338 is formed over carrier 336 as a temporary adhesive bonding film, etch-stop layer, or release layer.

Semiconductor die 324 are mounted to interface layer 338 and over carrier 336 using, for example, a pick and place operation with active surface 330 oriented toward carrier 336.

In FIG. 6b, an encapsulant or molding compound 340 is deposited over semiconductor die 324 using a paste printing, compressive molding, transfer molding, liquid encapsulant molding, vacuum lamination, or other suitable applicator. Encapsulant 340 can be polymer composite material, such as epoxy resin with filler, epoxy acrylate with filler, or polymer with proper filler. Encapsulant 340 is non-conductive, provides physical support, and environmentally protects semiconductor die 324 from external elements and contaminants. Alternatively, encapsulant 340 includes epoxide resins, silica, cresol novolac epoxy, phenol novolac, antimony, bromide, or carbon.

In FIG. 6c, carrier 336 and optional interface layer 338 are removed by chemical etching, mechanical peel-off, CMP, mechanical grinding, thermal bake, laser scanning, or wet stripping to expose active surface 330.

In FIG. 6d, a plurality of vias 342 are formed in encapsulant 340 using laser drilling, mechanical drilling, or DRIE. The vias 342 are filled with Al, Cu, Sn, Ni, Au, Ag, Ti, W, polysilicon, or other suitable electrically conductive material using electrolytic plating, electroless plating process, or other suitable metal deposition process to form conductive TSVs 342.

In FIG. 6e, an insulating layer 344 containing one or more layers of SiO2, Si3N4, SiON, Ta2O5, Al2O3, or other material having similar insulating and structural properties is formed over active surface 330, TSVs 342, and encapsulant 340. Insulating layer 344 is formed using PVD, CVD, printing, spin coating, spray coating, sintering or thermal oxidation. A portion of insulating layer 344 is removed by an etching process through a patterned photoresist layer to expose openings 346 and 348 over active surface 330. Alternatively, a portion of insulating layer 344 is removed by LDA using laser 345.

FIG. 6f shows semiconductor die or semiconductor die components 350, singulated from a semiconductor wafer similar to FIGS. 3a-3c, with a back surface 352 and active surface 354 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 354 to implement analog circuits or digital circuits, such as a DSP, ASIC, memory, or other signal processing circuit. Semiconductor die 350 may also contain IPDs, such as inductors, capacitors, and resistors, for RF signal processing.

An electrically conductive layer 356 is formed over active surface 354 using PVD, CVD, electrolytic plating, electroless plating process, or other suitable metal deposition process. Conductive layer 356 can be one or more layers of Al, Cu, Sn, Ni, Au, Ag, Ti, W, Pd, Pt, or other suitable electrically conductive material. Conductive layer 356 operates as contact pads 356 electrically connected to the circuits on active surface 354. Conductive layer 356 can be formed as contact pads 356 disposed side-by-side a first distance from the edge of semiconductor die 350. Alternatively, conductive layer 356 can be formed as contact pads that are offset in multiple rows such that a first row of contact pads is disposed a first distance from the edge of the die, and a second row of contact pads alternating with the first row is disposed a second distance from the edge of the die.

An electrically conductive bump material 358 is deposited over conductive layer 356 using an evaporation, electrolytic plating, electroless plating, ball drop, or screen printing process. Bump material 358 can be Al, Sn, Ni, Au, Ag, Pb, Bi, Cu, solder, and combinations thereof, with an optional flux solution. For example, the bump material can be eutectic Sn/Pb, high-lead solder, or lead-free solder. Bump material 358 is bonded to conductive layer 356 using a suitable attachment or bonding process. In one embodiment, the bump material is reflowed by heating the material above its melting point to form spherical balls or bumps 358. In some applications, bumps 358 are reflowed a second time to improve electrical contact to conductive layer 356. In one embodiment, bumps 358 are formed over a UBM having a wetting layer, barrier layer, and adhesive layer. The bumps can also be compression bonded or thermocompression bonded to conductive layer 356. Bumps 358 represent one type of interconnect structure that can be formed over conductive layer 356. The interconnect structure can also use bond wires, conductive paste, stud bump, micro bump, or other electrical interconnect.

Semiconductor die 350 is positioned over and mounted to semiconductor die 324 using a pick and place operation with active surface 354 oriented toward active surface 330. Openings 346 in insulating layer 344 receive bumps 358. In some embodiments, bumps 358 are reflowed to improve electrical contact to contact pads 332 of active surface 330. Bumps 358 provide the electrical connection between semiconductor die 350 and semiconductor die 324. Alternatively, an electrically conductive layer or RDL is formed in openings 346 using a patterning and metal deposition process such as printing, PVD, CVD, sputtering, electrolytic plating, and electroless plating. The conductive layer can be one or more layers of Al, Cu, Sn, Ni, Au, Ag, or other suitable electrically conductive material Alternatively, bumps 358 are formed in openings 346 or 348 in insulating layer 344 over semiconductor die 324 such that semiconductor die 350 does not have bumps 358. Accordingly, semiconductor die 350 are mounted to bumps 358 preformed in openings 346 and contact pads 356 are electrically and physically connected to bumps 358.

FIG. 6g shows semiconductor die 350 mounted and electrically connected to semiconductor die 324 via bumps 358. The combination of insulating layer 344 and bumps 358 reduces space between active surface 330 and active surface 354.

In FIG. 6h, a build-up interconnect structure 360 is formed over semiconductor die 324, insulating layer 344, and encapsulant 340 and interconnect structure 360 embeds semiconductor die 350. Interconnect structure 360 includes an insulating or passivation layer 362 containing one or more layers of SiO2, Si3N4, SiON, Ta2O5, Al2O3, or other material having similar insulating and structural properties. Insulating layer 362 is formed using PVD, CVD, printing, spin coating, spray coating, sintering or thermal oxidation. Overall reliability is enhanced by mounting semiconductor die 350 and subsequently embedding semiconductor 350 with interconnect structure 360. Semiconductor die 350 embedded in interconnect structure 360 increases structural security and protection from external environment. Interconnect structure 360 reduces gaps and space between semiconductor die 350 and interconnect structure 360. Further, gaps between semiconductor die 324 and semiconductor die 350 are reduced because bumps 358 and insulating layer 344 occupy a portion of space between semiconductor die 324 and semiconductor die 350.

Interconnect structure 360 further includes a first electrically conductive layer 364 formed in insulating layer 362 using a patterning and metal deposition process such as PVD, CVD, sputtering, electrolytic plating, and electroless plating. Conductive layer 364 can be one or more layers of Al, Cu, Sn, Ni, Au, Ag, or other suitable electrically conductive material. In some embodiments, a portion of conductive layer 364 is electrically connected to contact pads 332 of semiconductor die 324 through openings 348. Other portions of conductive layer 364 can be electrically common or electrically isolated depending on the design and function of the semiconductor device.

Interconnect structure 360 further includes a second electrically conductive layer 365 formed over insulating layer 362 using a patterning and metal deposition process such as PVD, CVD, sputtering, electrolytic plating, and electroless plating. Conductive layer 365 can be one or more layers of Al, Cu, Sn, Ni, Au, Ag, or other suitable electrically conductive material. In some embodiments, a portion of conductive layer 365 is electrically connected to conductive layer 364. Other portions of conductive layer 365 can be electrically common or electrically isolated depending on the design and function of the semiconductor device.

In FIG. 6i, an electrically conductive bump material 366 is deposited over build-up interconnect structure 360 and conductive layer 365 and electrically connected to conductive layer 365 using an evaporation, electrolytic plating, electroless plating, ball drop, or screen printing process. Bump material 366 can be Al, Sn, Ni, Au, Ag, Pb, Bi, Cu, solder, and combinations thereof, with an optional flux solution. For example, the bump material can be eutectic Sn/Pb, high-lead solder, or lead-free solder. Bump material 366 is bonded to conductive layer 365 using a suitable attachment or bonding process. In one embodiment, the bump material is reflowed by heating the material above its melting point to form spherical balls or bumps 366. In some applications, bumps 366 are reflowed a second time to improve electrical contact to conductive layer 365. The bumps can also be compression bonded to conductive layer 365. Bumps 366 represent one type of interconnect structure that can be formed over conductive layer 365. The interconnect structure can also use bond wires, stud bump, micro bump, or other electrical interconnect. In some embodiments, a portion of bump material 366 is electrically connected to conductive layer 365. Other portions of bump material 366 can be electrically common or electrically isolated depending on the design and function of the semiconductor device. Semiconductor die 324 are singulated with saw blade or laser cutting device 368 into individual semiconductor devices.

FIG. 6j shows WLCSP with embedded die after singulation. Semiconductor die 350 is mounted to active surface 330 with bumps 358 and insulating material 344 reducing space between active surface 330 of semiconductor die 324 and active surface 354 of semiconductor die 350. By electrically connecting semiconductor die 324 and 350 with bumps 358, the separation between the die is reduced resulting in a short and efficient signal path to improve electrical performance and increase operating speed of WLCSP with embedded die. WLCSP with embedded die provides enhanced reliability. Semiconductor die 350 is embedded in interconnect structure 360 to shield semiconductor die 350 from external environment. WLCSP with embedded die does not require underfill material between semiconductor die 324 and semiconductor die 350. WLCSP with embedded die reduces the existence of space or gaps between semiconductor die 350 and build-up layers. TSVs 342 provide additional interconnection between devices and components.

In FIG. 6k, a second build-up interconnect structure 370 is formed over encapsulant 340, back surface 328, and TSVs 342. Build-up interconnect structure 370 includes an insulating or passivation layer 372 containing one or more layers of SiO2, Si3N4, SiON, Ta2O5, Al2O3, or other material having similar insulating and structural properties. Insulating layer 372 is formed using PVD, CVD, printing, spin coating, spray coating, sintering or thermal oxidation.

Build-up interconnect structure 370 further includes an electrically conductive layer 374 formed in insulating layer 372 using a patterning and metal deposition process such as PVD, CVD, sputtering, electrolytic plating, and electroless plating. Conductive layer 374 can be one or more layers of Al, Cu, Sn, Ni, Au, Ag, or other suitable electrically conductive material. One portion of conductive layer 374 is electrically connected to TSVs 342. Other portions of conductive layer 374 can be electrically common or electrically isolated depending on the design and function of the semiconductor device.

In FIG. 6l, a second insulating layer 376 is formed over second interconnect structure 370. In some embodiments, second insulating layer 376 contains one or more layers of SiO2, Si3N4, SiON, Ta2O5, Al2O3, or other material having similar insulating and structural properties. In some embodiments, second insulating layer 376 is formed using PVD, CVD, printing, spin coating, spray coating, sintering or thermal oxidation. A portion of second insulating layer 376 is removed by laser 377 using LDA or other suitable process to form openings 380 over second interconnect structure 370 and back surface 328. In some embodiments, openings 380 expose a portion of conductive layer 374.

FIG. 6m shows an electrically conductive bump material 382 deposited over conductive layer 374 through openings 380 in second insulating layer 376 using an evaporation, electrolytic plating, electroless plating, ball drop, or screen printing process. The bump material can be Al, Sn, Ni, Au, Ag, lead (Pb), Bi, Cu, solder, and combinations thereof, with an optional flux solution. For example, the bump material can be eutectic Sn/Pb, high-lead solder, or lead-free solder. Bump material 382 is bonded to a portion of conductive layer 374 using a suitable attachment or bonding process. In one embodiment, the bump material is reflowed by heating the material above its melting point to form spherical balls or bumps 382. In some applications, bumps 382 are reflowed a second time to improve electrical contact to conductive layer 374. In one embodiment, bumps 382 are formed over a UBM having a wetting layer, barrier layer, and adhesive layer. The bumps can also be compression bonded or thermocompression bonded to conductive layer 374. Bumps 382 represent one type of interconnect structure that can be formed over conductive layer 374. The interconnect structure can also use bond wires, conductive paste, stud bump, micro bump, or other electrical interconnect. Alternatively, bumps 382 are formed on additional semiconductor components before singulation.

FIG. 6m further shows, continuing from FIG. 3c, additional semiconductor die or components 384 after singulation. Each semiconductor die 384 has a back surface 386 and active surface 388. In some embodiments, active surface 388 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 388 to implement analog circuits or digital circuits, such as DSP, ASIC, memory, or other signal processing circuit. Semiconductor die 384 may include discrete devices. Discrete devices can be active devices, such as transistors and diodes, or passive devices, such as capacitors, resistors, and inductors for RF signal processing. Semiconductor die 384 may also include a packaged semiconductor die. In one embodiment, semiconductor die 384 is a flipchip type device.

An electrically conductive layer 390 is formed over active surface 388 using PVD, CVD, electrolytic plating, electroless plating process, or other suitable metal deposition process. Conductive layer 390 can be one or more layers of Al, Cu, Sn, Ni, Au, Ag, or other suitable electrically conductive material. Conductive layer 390 operates as contact pads electrically connected to the circuits on active surface 388. Conductive layer 390 can be formed as contact pads disposed side-by-side a first distance from the edge of semiconductor die 384, as shown in FIG. 6m. Alternatively, conductive layer 390 can be formed as contact pads that are offset in multiple rows such that a first row of contact pads is disposed a first distance from the edge of the die, and a second row of contact pads alternating with the first row is disposed a second distance from the edge of the die. Alternatively, bumps 382 are formed on conductive layer 390 of semiconductor die 384 before singulation.

FIG. 6n shows WLCSP 392 with embedded die after singulation and further including z-interconnects and additional interconnect structures for additional semiconductor component stacking. Conductive vias 342 are z-direction interconnects formed between bottom-side build-up interconnect structure 360 and topside build-up interconnect structure 370. Semiconductor die 350 is mounted to active surface 330 with bumps 358 and insulating material 344 reducing space between active surface 330 of semiconductor die 324 and active surface 354 of semiconductor die 350. By electrically connecting semiconductor die 324 and 350 with bumps 358, the separation between the die is reduced resulting in a short and efficient signal path to improve electrical performance and increase operating speed of WLCSP 392 with embedded die. WLCSP 392 with embedded die provides enhanced reliability. Semiconductor die 350 is embedded in interconnect structure 360 to shield semiconductor die 350 from external environment. WLCSP 392 with embedded die does not require underfill material between semiconductor die 324 and semiconductor die 350. WLCSP 392 with embedded die reduces the existence of space or gaps between semiconductor die 350 and build-up layers.

Figure 7:
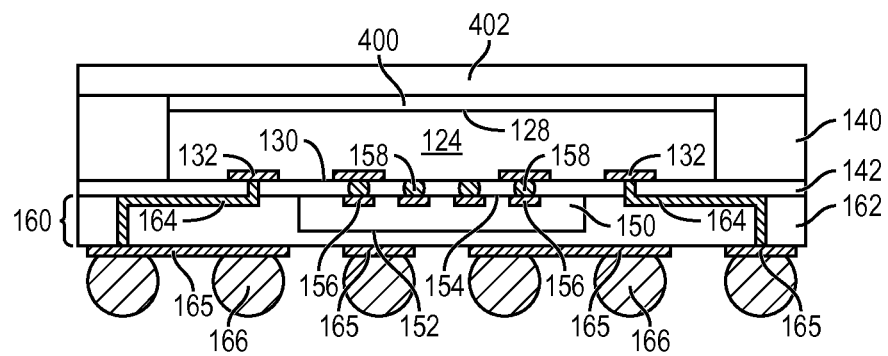
FIG. 7 illustrates an embodiment including thermal interface material (TIM) and heat sink formed over the first semiconductor die.

FIG. 7, similar to and continuing from FIG. 3m, shows a cross sectional view of an alternative embodiment using thermal interface material. Encapsulant 140 is thinned in a subsequent backgrinding step. Encapsulant 140 is thinned to expose a cavity of encapsulant over back surface 128.

A TIM 400 is deposited in the cavity of encapsulant 140 over back surface 128 of semiconductor die 124, opposite active surface 130. TIM 400 can be aluminum oxide, zinc oxide, boron nitride, or pulverized silver. A heat sink 402 is mounted over TIM 400 and encapsulant 140. Heat sink 402 can be Al, Cu, or another material with high thermal conductivity to provide heat dissipation for semiconductor die 124. TIM 400 aids in the distribution and dissipation of heat generated by semiconductor die 124. Alternatively, heat sink 402 is mounted over encapsulant 140 and back surface 152.

Figure 8:
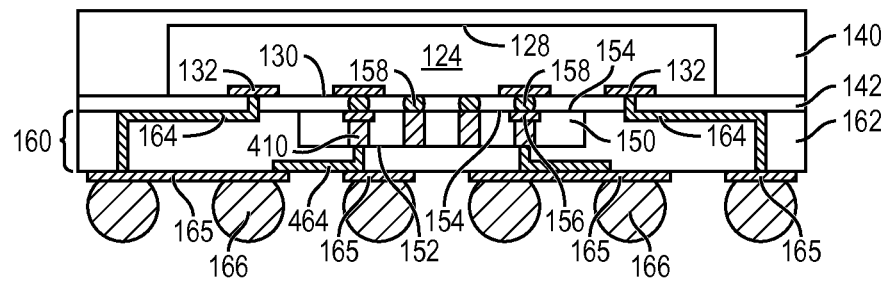
FIG. 8 illustrates an embodiment including second semiconductor die TSV application for further interconnection between semiconductor die.

FIG. 8, similar to and continuing from FIG. 3m, shows an alternative embodiment with conductive TSVs 410 formed in the embedded semiconductor die 150. A plurality of conductive vias 410 is formed in semiconductor die 150 using laser drilling, mechanical drilling, or DRIE. The vias 410 are filled with Al, Cu, Sn, Ni, Au, Ag, Ti, W, poly-silicon, or other suitable electrically conductive material using PVD, CVD, electrolytic plating, electroless plating process, or other suitable metal deposition process to form conductive TSVs 410. Alternatively, conductive pillars are formed in and around semiconductor die 150. Conductive pillars are formed by depositing a photoresist layer, etching vias in the photoresist, filling the vias with conductive material, and removing the photoresist layer, leaving the conductive pillars.

Interconnect structure 160 further includes an additional electrically conductive layer 464 formed in insulating layer 162 using a patterning and metal deposition process such as PVD, CVD, sputtering, electrolytic plating, and electroless plating. Conductive layer 464 can be one or more layers of Al, Cu, Sn, Ni, Au, Ag, or other suitable electrically conductive material. One portion of conductive layer 464 is electrically connected to TSVs 410. One portion of conductive layer 464 is electrically connected to conductive layer 165. Other portions of conductive layer 464 can be electrically common or electrically isolated depending on the design and function of the semiconductor device.

Figure 9:
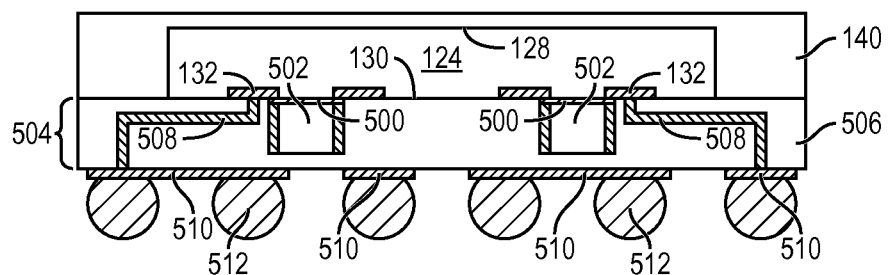
FIG. 9 illustrates an embodiment including embedded passive components application.

FIG. 9, similar to and continuing from FIG. 3g, shows an alternative embodiment with embedded passive components application. In place of insulating layer 142, an adhesive layer 500 is formed over active surface 130 and over contact pads 132. Adhesive layer 500 can be thermal epoxy, epoxy resin, B-stage epoxy laminating film, ultraviolet (UV) B-stage film adhesive layer, UV B-stage film adhesive layer including acrylic polymer, thermo-setting adhesive film layer, wire-in-film (WIF) encapsulant material, a suitable wafer backside coating, epoxy resin with organic filler, silica filler, or polymer filler, acrylate based adhesive, epoxy-acrylate adhesive, or a PI-based adhesive. Adhesive layer 500 is generally only minimally conductive. In some embodiments, however, adhesive layer 500 includes a non-conductive material.

IPDs 502, such as inductors, capacitors, and resistors are mounted to active surface 130 over contact pads 132 via the adhesive layer 500. Alternatively, IPDs 502 are mounted to contact pads 132 by, for example, solder reflow. A portion of IPDs 502 is electrically connected to contact pads 132. Other portions of IPDs 502 can be electrically common or electrically isolated depending on the design and function of the semiconductor device.

A build-up interconnect structure 504 is formed over active surface 130, encapsulant 140, and passive devices 502 to embed IPDs 502. Interconnect structure 504 includes an insulating or passivation layer 506 containing one or more layers of SiO2, Si3N4, SiON, Ta2O5, Al2O3, or other material having similar insulating and structural properties. Insulating layer 500 is formed using PVD, CVD, printing, spin coating, spray coating, sintering or thermal oxidation.

Interconnect structure 504 further includes a first electrically conductive layer 508 formed in insulating layer 506 over active surface 130 using a patterning and metal deposition process such as PVD, CVD, sputtering, electrolytic plating, and electroless plating. Conductive layer 508 can be one or more layers of Al, Cu, Sn, Ni, Au, Ag, or other suitable electrically conductive material. One portion of conductive layer 508 is electrically connected to contact pads 132 of semiconductor die 124. Other portions of conductive layer 508 can be electrically common or electrically isolated depending on the design and function of the semiconductor device.

Interconnect structure 504 further includes a second electrically conductive layer 510 formed over insulating layer 506 using a patterning and metal deposition process such as PVD, CVD, sputtering, electrolytic plating, and electroless plating. Conductive layer 510 can be one or more layers of Al, Cu, Sn, Ni, Au, Ag, or other suitable electrically conductive material. One portion of conductive layer 510 is electrically connected to conductive layer 508. Other portions of conductive layer 510 can be electrically common or electrically isolated depending on the design and function of the semiconductor device.

An electrically conductive bump material 512 is deposited over insulating layer 506 and conductive layer 510 using an evaporation, electrolytic plating, electroless plating, ball drop, or screen printing process. Bump material 512 can be Al, Sn, Ni, Au, Ag, Pb, Bi, Cu, solder, and combinations thereof, with an optional flux solution. For example, the bump material can be eutectic Sn/Pb, high-lead solder, or lead-free solder. Bump material 512 is bonded to conductive layer 510 using a suitable attachment or bonding process. In one embodiment, the bump material is reflowed by heating the material above its melting point to form spherical balls or bumps 512. In some applications, bumps 512 are reflowed a second time to improve electrical contact to conductive layer 510. The bumps can also be compression bonded to conductive layer 510. Bumps 512 represent one type of interconnect structure that can be formed over conductive layer 510. The interconnect structure can also use bond wires, stud bump, micro bump, or other electrical interconnect. One portion of bump material 512 is electrically connected to conductive layer 510. Other portions of bump material 512 can be electrically common or electrically isolated depending on the design and function of the semiconductor device.

While one or more embodiments of the present invention have been illustrated in detail, the skilled artisan will appreciate that modifications and adaptations to those embodiments may be made without departing from the scope of the present invention as set forth in the following claims.

What is claimed:
1. A semiconductor device, comprising:
a first semiconductor die;
a first conductive via formed in the first semiconductor die;
an encapsulant deposited around the first semiconductor die;
a first insulating layer formed on the first semiconductor die and a surface of the encapsulant and including an opening extending from a surface of the first insulating layer to a first contact pad on an active surface of the first semiconductor die;

a second insulating layer formed over the first insulating layer;

a second semiconductor die embedded in the second insulating layer and including an active surface oriented toward the active surface of the first semiconductor die;

a conductive layer formed through the second insulating layer outside a footprint of the second semiconductor die and extending to a second contact pad on the active surface of the first semiconductor die; and a bump disposed in the opening of the first insulating layer.

2. The semiconductor device of claim 1, further including a second conductive via formed in the encapsulant.

3. The semiconductor device of claim 1, further including a second conductive via formed in the second semiconductor die.

4. The semiconductor device of claim 1, further including an interconnect structure formed over a surface of the first semiconductor die opposite the first insulating layer.

5. The semiconductor device of claim 1, further including a semiconductor component disposed over the first semiconductor die opposite the first insulating layer.

6. A semiconductor device, comprising:
a first semiconductor die;
a first conductive via formed through the first or second semiconductor die;
an encapsulant deposited around the semiconductor die;
a first insulating layer formed on the first semiconductor die and encapsulant and including an opening extending to a first contact pad on an active surface of the first semiconductor die;
a first interconnect structure formed over the first insulating layer and including a conductive layer extending to a second contact pad on the active surface of the first semiconductor die;
a second semiconductor die embedded in the first interconnect structure; and
a bump disposed in the opening in the first insulating layer.

7. The semiconductor device of claim 6, further including a second interconnect structure formed over the first semiconductor die opposite the first insulating layer.

8. The semiconductor device of claim 6, wherein the first interconnect structure further includes a second insulating layer.

9. A semiconductor device, comprising:
a first semiconductor die;
a first conductive via formed in the first semiconductor die;
a first insulating layer formed over the first semiconductor die and including an opening extending to a first contact pad on an active surface of the first semiconductor die;
a second insulating layer formed over the first semiconductor die;
a second semiconductor die embedded in the second insulating layer;
a conductive layer formed through the second insulating layer and extending to a second contact pad on the active surface of the first semiconductor die; and
a bump disposed in the opening in the first insulating layer.

10. The semiconductor device of claim 9, further including a heat sink disposed over the first semiconductor die.

11. The semiconductor device of claim 9, further including an interconnect structure formed over the second insulating layer.

12. The semiconductor device of claim 9, further including an encapsulant deposited around the first semiconductor die.

13. The semiconductor device of claim 12, wherein the first insulating layer is formed over a surface of the encapsulant.

14. The semiconductor device of claim 12, further including a second conductive via formed in the encapsulant.

15. The semiconductor device of claim 6, wherein an active surface of the second semiconductor die is oriented toward the active surface of the first semiconductor die.

* * * * *